(12) United States Patent
Lin et al.

(10) Patent No.: US 11,906,661 B2
(45) Date of Patent: *Feb. 20, 2024

(54) SILICON PHOTONICS DEVICE FOR LIDAR SENSOR AND METHOD FOR FABRICATION

(71) Applicant: Aurora Operations, Inc., Mountain View, CA (US)

(72) Inventors: Sen Lin, Santa Clara, CA (US); Andrew Steil Michaels, Santa Clara, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/853,674

(22) Filed: Jun. 29, 2022

(65) Prior Publication Data

US 2023/0161006 A1  May 25, 2023

Related U.S. Application Data

(63) Continuation of application No. 17/535,013, filed on Nov. 24, 2021, now Pat. No. 11,415,673.

(51) Int. Cl.
*G01S 7/48* (2006.01)
*G01S 7/481* (2006.01)
*G01S 17/931* (2020.01)

(52) U.S. Cl.
CPC .......... *G01S 7/4813* (2013.01); *G01S 17/931* (2020.01)

(58) Field of Classification Search
None
See application file for complete search history.

(56) References Cited

U.S. PATENT DOCUMENTS

| | | | |
|---|---|---|---|
| 2009/0154872 | A1 | 6/2009 | Sherrer et al. |
| 2013/0114924 | A1 | 5/2013 | Loh et al. |
| 2014/0308004 | A1 | 10/2014 | Doany et al. |

(Continued)

FOREIGN PATENT DOCUMENTS

| | | |
|---|---|---|
| CN | 113053835 A | 6/2021 |
| KR | 20210034512 A | 3/2021 |
| WO | 2020158322 A1 | 12/2021 |

OTHER PUBLICATIONS

Brescia, Jonathan R., "Grating Coupler for Surface Waves Based on Electrical Displacement Currents" (2019). Honors Undergraduate Theses 457 (Year: 2019).

(Continued)

*Primary Examiner* — Hovhannes Baghdasaryan
(74) *Attorney, Agent, or Firm* — PATENT LAW WORKS LLP

(57) ABSTRACT

A structure of a silicon photonics device for LIDAR includes a first insulating structure and a second insulating structure disposed above one or more etched silicon structures overlying a substrate member. A metal layer is disposed above the first insulating structure without a prior deposition of a diffusion barrier and adhesion layer. A thin insulating structure is disposed above the second insulating structure. A first configuration of the metal layer, the first insulating structure and the one or more etched silicon structures forms a free-space coupler. A second configuration of the thin insulating structure above the second insulating structure forms an edge coupler.

20 Claims, 12 Drawing Sheets

(56) References Cited

U.S. PATENT DOCUMENTS

| | | |
|---|---|---|
| 2015/0285998 A1 | 10/2015 | Babakhani |
| 2016/0372606 A1 | 12/2016 | Ito |
| 2020/0203532 A1 | 6/2020 | Yamazaki et al. |
| 2021/0098860 A1* | 4/2021 | Kuo .................... H01L 23/5384 |

OTHER PUBLICATIONS

International Search Report and Written Opinion for PCT/US2022/080186, dated Apr. 3, 2023, 8 pgs.

* cited by examiner

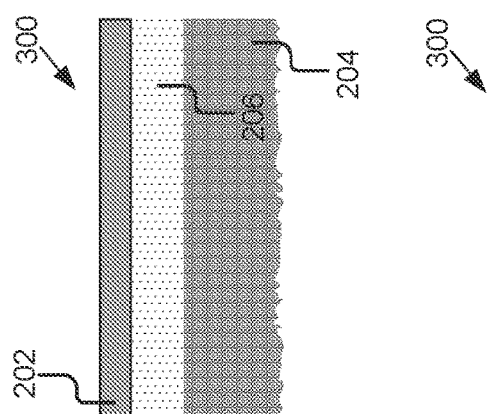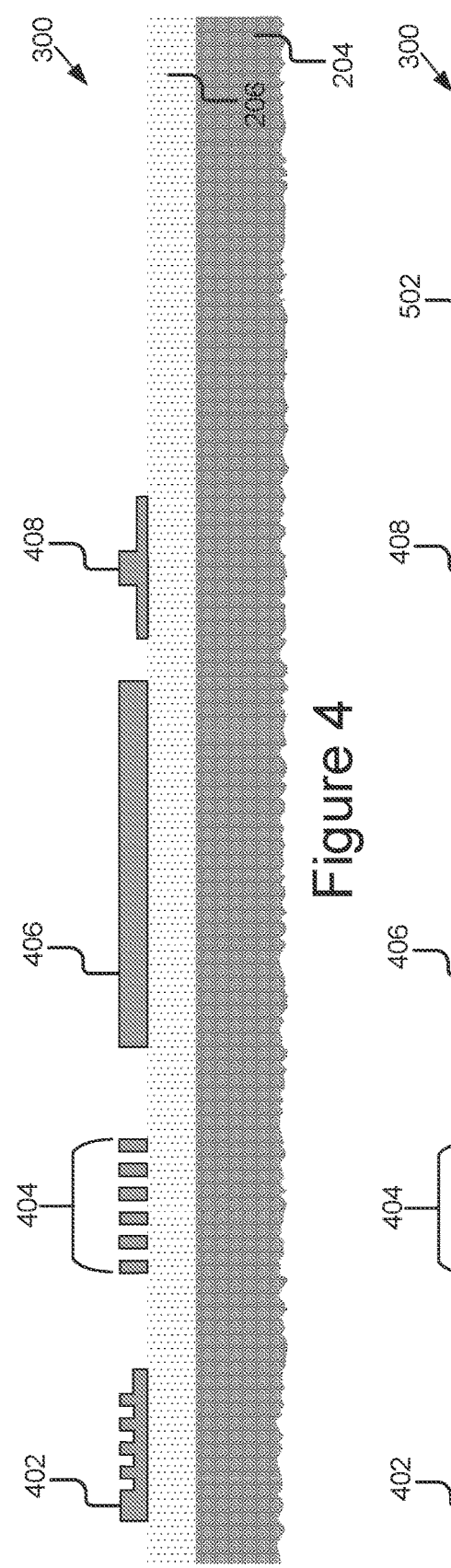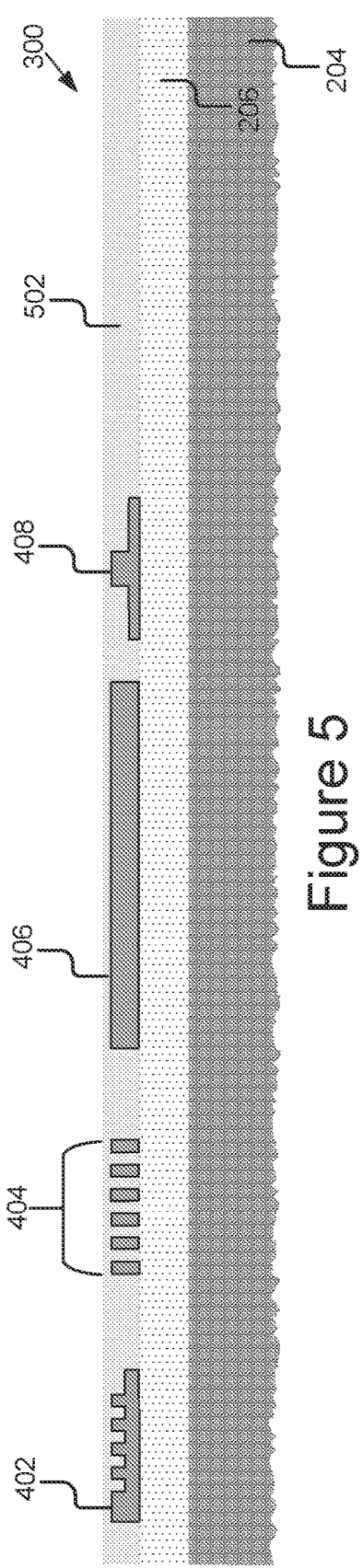
Figure 3
Figure 4
Figure 5

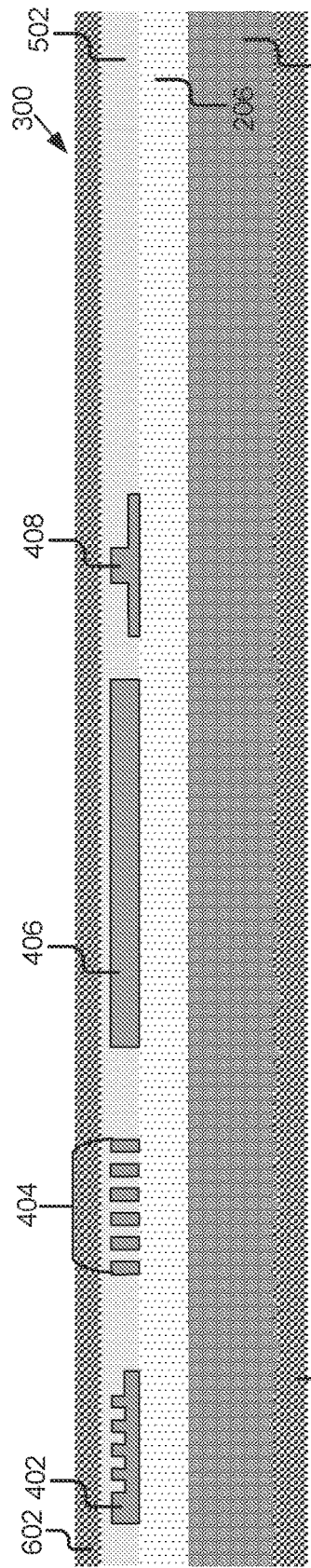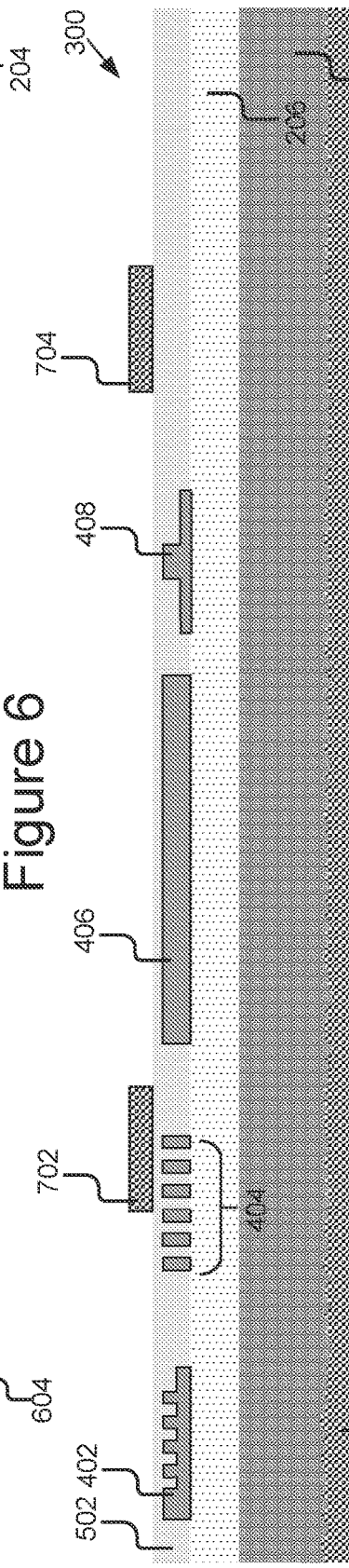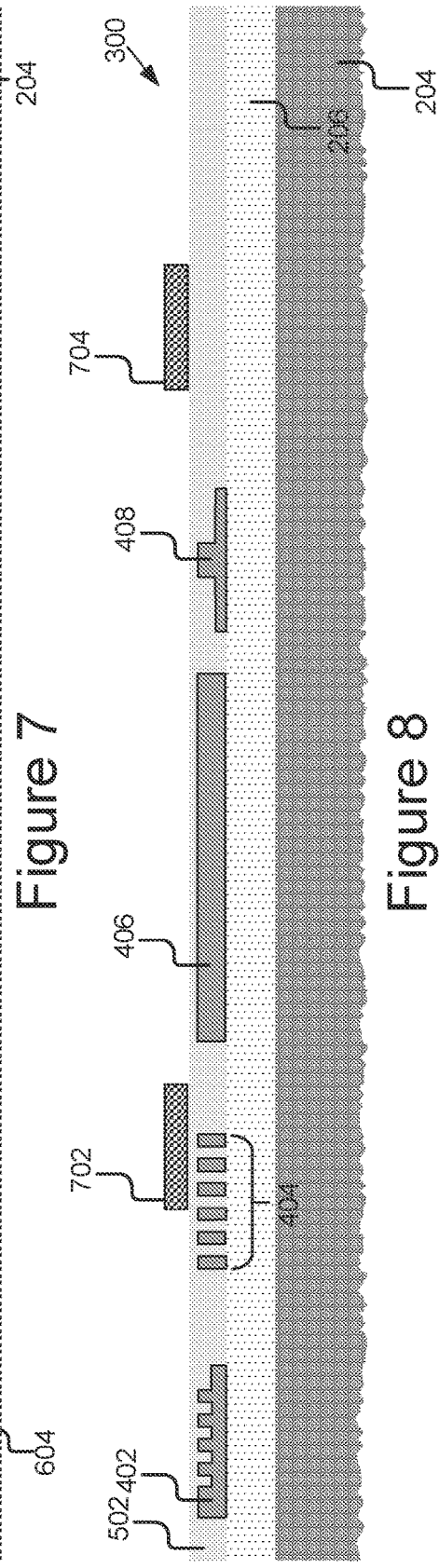

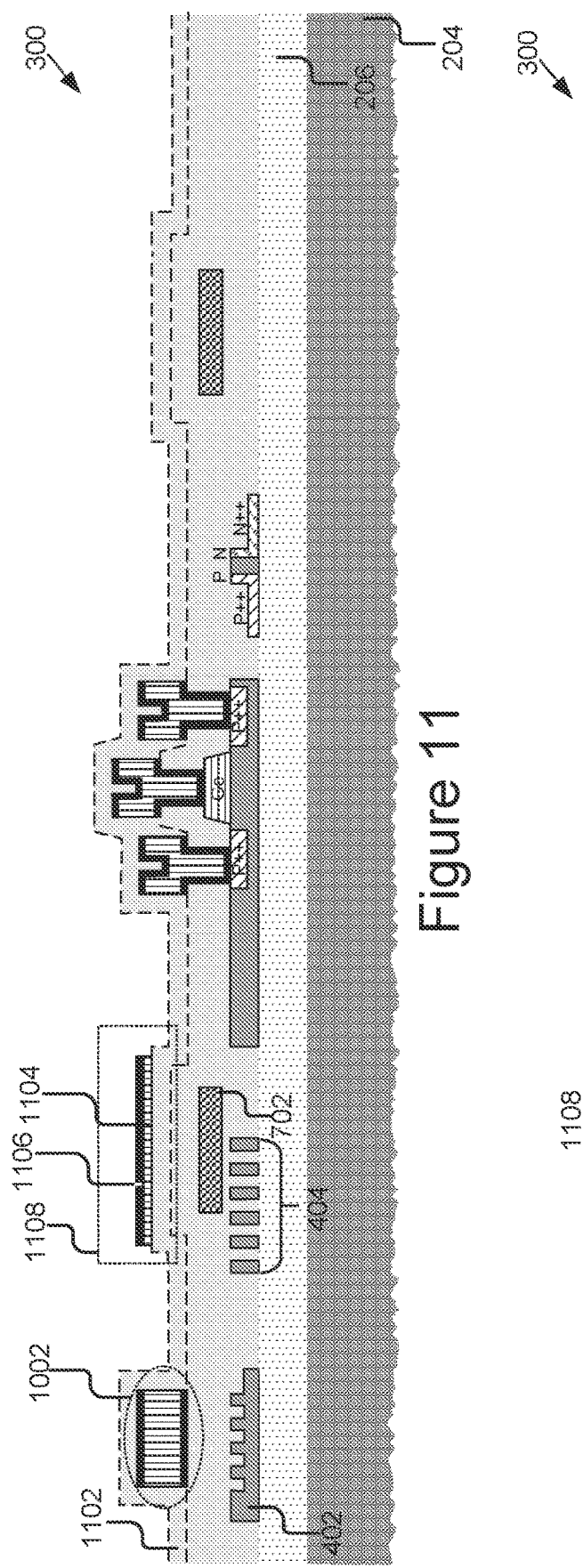
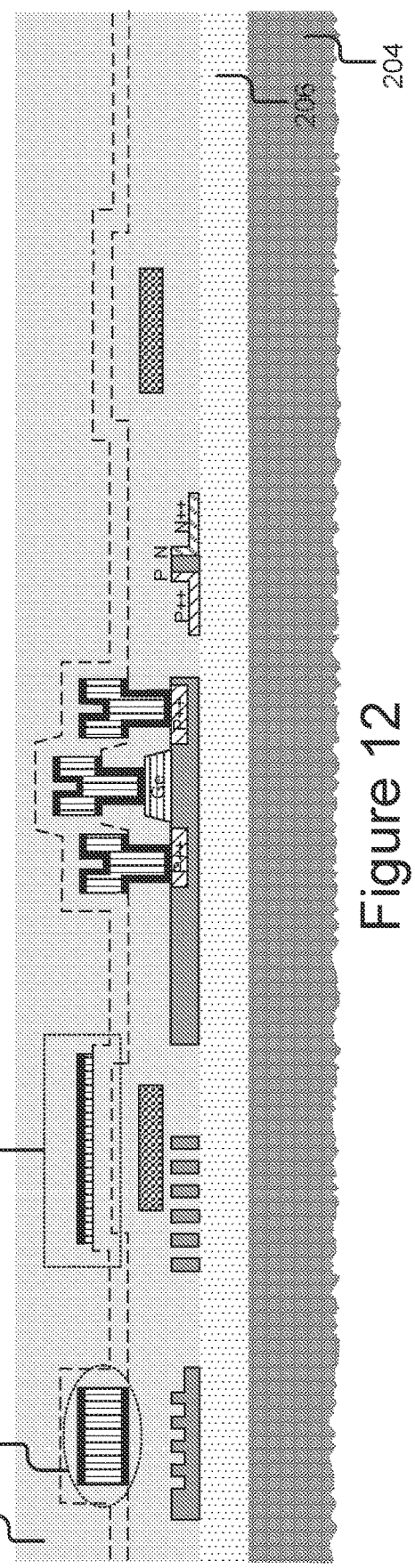

SILICON PHOTONICS DEVICE FOR LIDAR SENSOR AND METHOD FOR FABRICATION

CROSS REFERENCE TO RELATED APPLICATIONS

This application is a continuation of U.S. patent application Ser. No. 17/535,013, filed Nov. 24, 2021, and entitled "Silicon Photonics Device for LIDAR Sensor and Method for Fabrication," which is incorporated herein by reference in their entirety.

TECHNICAL FIELD

The present disclosure pertains generally to a silicon photonics device, and more specifically to a silicon photonics device for light detection and ranging (LIDAR) applications and a method of fabricating the same.

BACKGROUND

LIDAR, also sometimes called laser RADAR, is used for a variety of applications, including imaging and collision avoidance. Various components used in a LIDAR system, such as modulators, optical filters, optical switches, optical waveguides, photodiodes, phase shifters, wavelength converters, etc. are implemented on complementary metal oxide semiconductor (CMOS) compatible silicon photonics chips, such as silicon-on-insulator (SOI) platform. One key challenge faced in LIDAR system development is an insufficiency associated with coupling efficiency, wavelength sensitivity, reliability, and link budget performance of the various components.

SUMMARY

The present disclosure describes a structure of a silicon photonics device for LIDAR. The silicon photonics device includes a substrate member, an antenna formed on the substrate member, and a photodiode formed on the substrate member and coupled to the antenna. The antenna is a one-dimensional grating coupler. The antenna includes a first grating structure coupled to the substrate, a first dielectric structure coupled to the first grating structure, and a first metal layer coupled to the first dielectric structure. The antenna includes a second grating structure coupled to the substrate and the first metal layer coupled to the second grating structure. A diffusion barrier and adhesion layer is coupled to the first metal layer, the diffusion barrier and adhesion layer and the first metal layer forming a reflective mirror structure. The silicon photonics device further includes a second insulating structure coupled to a third insulating structure, the second insulating structure and the third insulating structure forming an edge coupler.

The present disclosure describes a method for fabricating a silicon photonics device for LIDAR. The method includes obtaining a substrate member and forming a silicon structure on the substrate member, forming a first dielectric structure above the silicon structure, disposing a first oxide layer above the first dielectric structure, forming a metal layer above the first oxide layer and the first dielectric structure, and forming a diffusion barrier and adhesion layer above the metal layer. The method further includes forming the first dielectric structure by disposing a first layer of insulator compound above the silicon structure and etching the first layer of insulator compound to form the first dielectric structure. The method further includes disposing a second layer of insulator compound on a bottom side of the substrate member before etching the first layer of insulator compound, and removing the second layer of insulator compound disposed on the bottom side of the substrate member after forming the first dielectric structure. The method further includes forming a second dielectric structure and forming a third dielectric structure over the second dielectric structure and the first oxide layer. The method further includes forming the third dielectric structure by disposing a second oxide layer above the metal layer, etching an opening in the second oxide layer above the second dielectric structure, and forming the third dielectric structure above the second dielectric structure in the opening. The method further includes forming a second silicon structure on the substrate member, doping portions of the second silicon structure to form a photodiode, and forming metal contacts for the photo diode above the doped portions of the second silicon structure. The method further includes forming a second silicon structure on the substrate member, forming a second diffusion barrier and adhesion layer above the second silicon structure, forming a second metal layer above the second diffusion barrier and adhesion layer and the second silicon structure, and forming a third diffusion barrier and adhesion layer above the second metal layer. The present disclosure describes a silicon photonics device fabricated by the method as described herein. The present disclosure also describes a LIDAR sensor system including a silicon photonics device fabricated by the method as described herein.

Those skilled in the art will appreciate that the summary is illustrative only and is not intended to be in any way limiting. Any of the features described herein may be used with any other features, and any subset of such features can be used in combination according to various embodiments. Other aspects, inventive features, and advantages of the devices and/or processes described herein, as defined solely by the claims, will become apparent in the detailed description set forth herein and taken in conjunction with the accompanying drawings. Moreover, the language used in the present disclosure has been principally selected for readability and instructional purposes, and not to limit the scope of the subject matter disclosed herein.

BRIEF DESCRIPTION OF THE DRAWINGS

Implementations are illustrated by way of example, and not by way of limitation, in the figures of the accompanying drawings in which like reference numerals refer to similar elements and in which:

FIGS. 3-17 depict schematic, cross-sectional diagrams illustrating a method for fabricating the silicon photonics device shown in FIG. 1B according to some implementations.

Figure 1A:
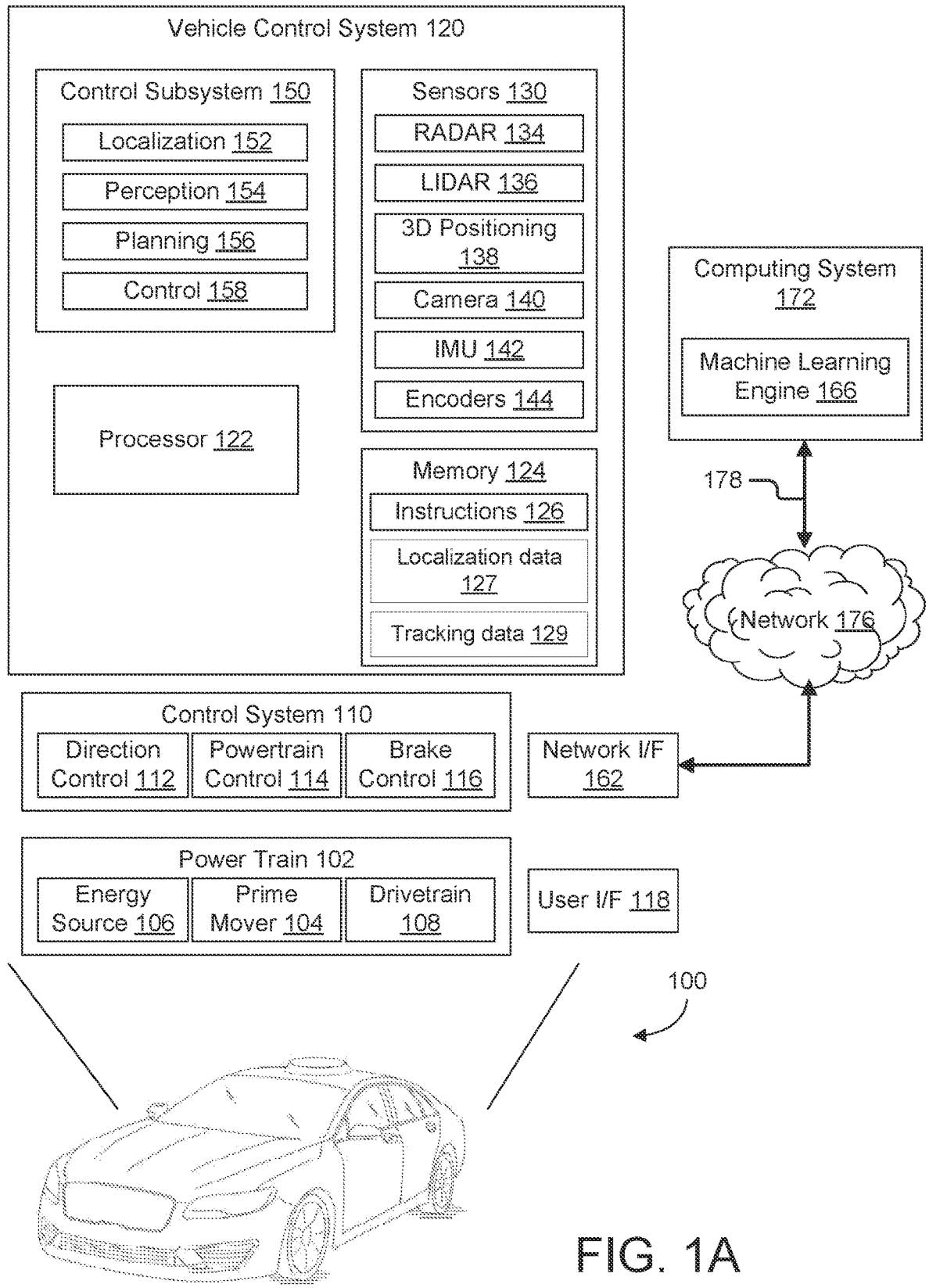
FIG. 1A is a block diagram illustrating an example of a hardware and software environment for an autonomous vehicle according to some implementations.

It should be understood that alternative implementations of the structures and methods illustrated herein may be employed without departing from the principles described herein.

DETAILED DESCRIPTION

In the following description, for purposes of explanation, numerous specific details are set forth to provide a thorough understanding of the various aspects of different example implementations. Note that any particular example implementation may in various cases be practiced without all of the specific details and/or with variations, permutations, and combinations of the various features and elements described herein. Reference will now be made in detail to the implementations of the present disclosure, examples of which are illustrated in the accompanying drawings. Wherever possible, the same reference numbers are used in the drawings and the description to refer to the same or like parts.

Furthermore, relative terms, such as "lower" or "bottom" or "back" or "below" and "upper" or "top" or "front" or "above" may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The example term "lower" can, therefore, encompass both an orientation of "lower" and "upper," depending upon the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Referring to the drawings, wherein like numbers denote like parts throughout the several views, FIG. 1A illustrates an example hardware and software environment for an autonomous vehicle 100 within which various techniques disclosed herein may be implemented. The vehicle 100, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 100 may be implemented as any number of different types of vehicles, including vehicles capable of transporting people and/or cargo, and capable of traveling by land and it should be appreciated that the aforementioned components 102-116 may vary widely based upon the type of vehicle within which these components are utilized.

For simplicity, the implementations discussed hereinafter focus on a wheeled land vehicle such as a car, van, truck, bus, etc. In such implementations, the prime mover 104 may include one or more electric motors and/or an internal combustion engine (among others). The energy source 106 may include, for example, a fuel system (e.g., providing gasoline, diesel, hydrogen, etc.), a battery system, solar panels or other renewable energy source, and/or a fuel cell system. The drivetrain 108 includes wheels and/or tires along with a transmission and/or any other mechanical drive components suitable for converting the output of the prime mover 104 into vehicular motion, as well as one or more brakes configured to controllably stop or slow the vehicle 100 and direction or steering components suitable for controlling the trajectory of the vehicle 100 (e.g., a rack and pinion steering linkage enabling one or more wheels of the vehicle 100 to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in other implementations, multiple electric motors (e.g., dedicated to individual wheels or axles) may be used as a prime mover 104. In the case of a hydrogen fuel cell implementation, the prime mover 104 may include one or more electric motors and the energy source 106 may include a fuel cell system powered by hydrogen fuel.

The direction control 112 may include one or more actuators and/or sensors for controlling and receiving feedback from the direction or steering components to enable the vehicle 100 to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 100. The brake control 116 may be configured to control one or more brakes that slow or stop vehicle 100, e.g., disk or drum brakes coupled to the wheels of the vehicle.

Other vehicle types, including, but not limited to, all-terrain or tracked vehicles, and construction equipment, may utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, full or semi-autonomous control over the vehicle 100 is implemented in a vehicle control system 120, which may include one or more processors 122 and one or more memories 124, with each processor 122 configured to execute program code instructions 126 stored in a memory 124. The processors(s) can include, for example, graphics processing unit(s) ("GPU(s)") and/or central processing unit(s) ("CPU(s)").

Sensors 130 may include various sensors suitable for collecting information from a vehicle's surrounding environment for use in controlling the operation of the vehicle 100. For example, sensors 130 can include one or more detection and ranging sensors (e.g., a RADAR sensor 134, a LIDAR sensor 136, or both), a 3D positioning sensor 138, e.g., a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can optionally include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle 100 in three directions. One or more encoders 144, such as wheel encoders may be used to monitor the rotation of one or more wheels of vehicle 100. In some implementations, the LIDAR sensor 136 may include a structure of the silicon photonics device for the coherent LIDAR system as described in detail below.

The outputs of sensors 130 may be provided to a set of control subsystems 150, including, a localization subsystem 152, a perception subsystem 154, a planning subsystem 156, and a control subsystem 158. The localization subsystem 152 is principally responsible for precisely determining the location and orientation (also sometimes referred to as "pose" or "pose estimation") of the vehicle 100 within its surrounding environment, and generally within some frame of reference. The perception subsystem 154 is principally responsible for detecting, tracking, and/or identifying objects within the environment surrounding vehicle 100. A machine learning model in accordance with some implementations can be utilized in tracking objects. The planning subsystem 156 is principally responsible for planning a trajectory or a path of motion for vehicle 100 over some timeframe given a desired destination as well as the static and moving objects within the environment. A machine learning model in accordance with some implementations can be utilized in planning a vehicle trajectory. The control subsystem 158 is principally responsible for generating suitable control signals for controlling the various controls in the vehicle control system 120 in order to implement the planned trajectory of the vehicle 100. Similarly, a machine learning model can be utilized to generate one or more signals to control the autonomous vehicle 100 to implement the planned trajectory.

It should be appreciated that the collection of components illustrated in FIG. 1A for the vehicle control system 120 is merely one example. Individual sensors may be omitted in some implementations. Additionally, or alternatively, in some implementations, multiple sensors of the same types illustrated in FIG. 1A may be used for redundancy and/or to cover different regions around a vehicle. Moreover, there may be additional sensors of other types beyond those described above to provide actual sensor data related to the operation and environment of the wheeled land vehicle. Likewise, different types and/or combinations of control subsystems may be used in other implementations. Further, while subsystems 152-158 are illustrated as being separate from processor 122 and memory 124, it should be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 100 may also include a secondary vehicle control system (not illustrated), which may be used as a redundant or backup control system for the vehicle 100. In some implementations, the secondary vehicle control system may be capable of fully operating the autonomous vehicle 100 in the event of an adverse event in the vehicle control system 120, while in other implementations, the secondary vehicle control system may only have limited functionality, e.g., to perform a controlled stop of the vehicle 100 in response to an adverse event detected in the primary vehicle control system 120. In still other implementations, the secondary vehicle control system may be omitted.

In general, different architectures, including various combinations of software, hardware, circuit logic, sensors, networks, etc. may be used to implement the various components illustrated in FIG. 1A. Each processor may be implemented, for example, as a microprocessor and each memory may represent the random-access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 100, e.g., any cache memory in a processor, as well as any storage capacity used as a virtual memory, e.g., as stored on a mass storage device or another computer controller. One or more processors 122 illustrated in FIG. 1A, or entirely separate processors, may be used to implement additional functionality in the vehicle 100 outside of the purposes of autonomous control, e.g., to control entertainment systems, to operate doors, lights, convenience features, etc.

In addition, for additional storage, the vehicle 100 may include one or more mass storage devices, e.g., a removable disk drive, a hard disk drive, a direct access storage device ("DASD"), an optical drive (e.g., a CD drive, a DVD drive, etc.), a solid-state storage drive ("SSD"), network attached storage, a storage area network, and/or a tape drive, among others.

Furthermore, the vehicle 100 may include a user interface 118 to enable vehicle 100 to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 100 may include one or more network interfaces, e.g., network interface 162, suitable for communicating with one or more networks 176 to permit the communication of information with other computers and electronic devices, including, for example, a central service, such as a cloud service, from which the vehicle 100 receives information including trained machine learning models and other data for use in autonomous control thereof. The one or more networks 176, for example, may be a communication network and include a wide area network ("WAN") such as the Internet, one or more local area networks ("LANs") such as Wi-Fi LANs, mesh networks, etc., and one or more bus subsystems. The one or more networks 176 may optionally utilize one or more standard communication technologies, protocols, and/or inter-process communication techniques. In some implementations, data collected by the one or more sensors 130 can be uploaded to a computing system 172 via the network 176 for additional processing.

In the illustrated implementation, the vehicle 100 may communicate via the network 176 and signal line 178 with a computing system 172. In some implementations, the computing system 172 is a cloud-based computing device. The machine learning engine 166, operable on the computing system 172, generates a machine learning model based on the simulation scenario and simulated sensor data for use in autonomous control of the vehicle 100. The machine learning model may be sent from the computing system 172 to vehicle 100 to be used in the appropriate control subsystem 152-158 for use in performing its respective function.

Each processor illustrated in FIG. 1A, as well as various additional controllers and subsystems disclosed herein, generally operates under the control of an operating system and executes or otherwise relies upon various computer software applications, components, programs, objects, modules, data structures, etc., as described in greater detail below. Moreover, various applications, components, programs, objects, modules, etc. may also execute on one or more processors in another computer (e.g., computing system 172) coupled to vehicle 100 via network 176, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, are referred to herein as "program code." Program code typically comprises one or more instructions that are resident at various times in various memory and storage devices, and that, when read and executed by one or more processors, perform the steps necessary to execute steps or elements embodying the various aspects of the present disclosure. Moreover, while implementations have and hereinafter are described in the context of fully functioning computers and systems, it should be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The example environment illustrated in FIG. 1A is not intended to limit implementations disclosed herein. Indeed, other alternative hardware and/or software environments may be used without departing from the scope of implementations disclosed herein.

Figure 1B:
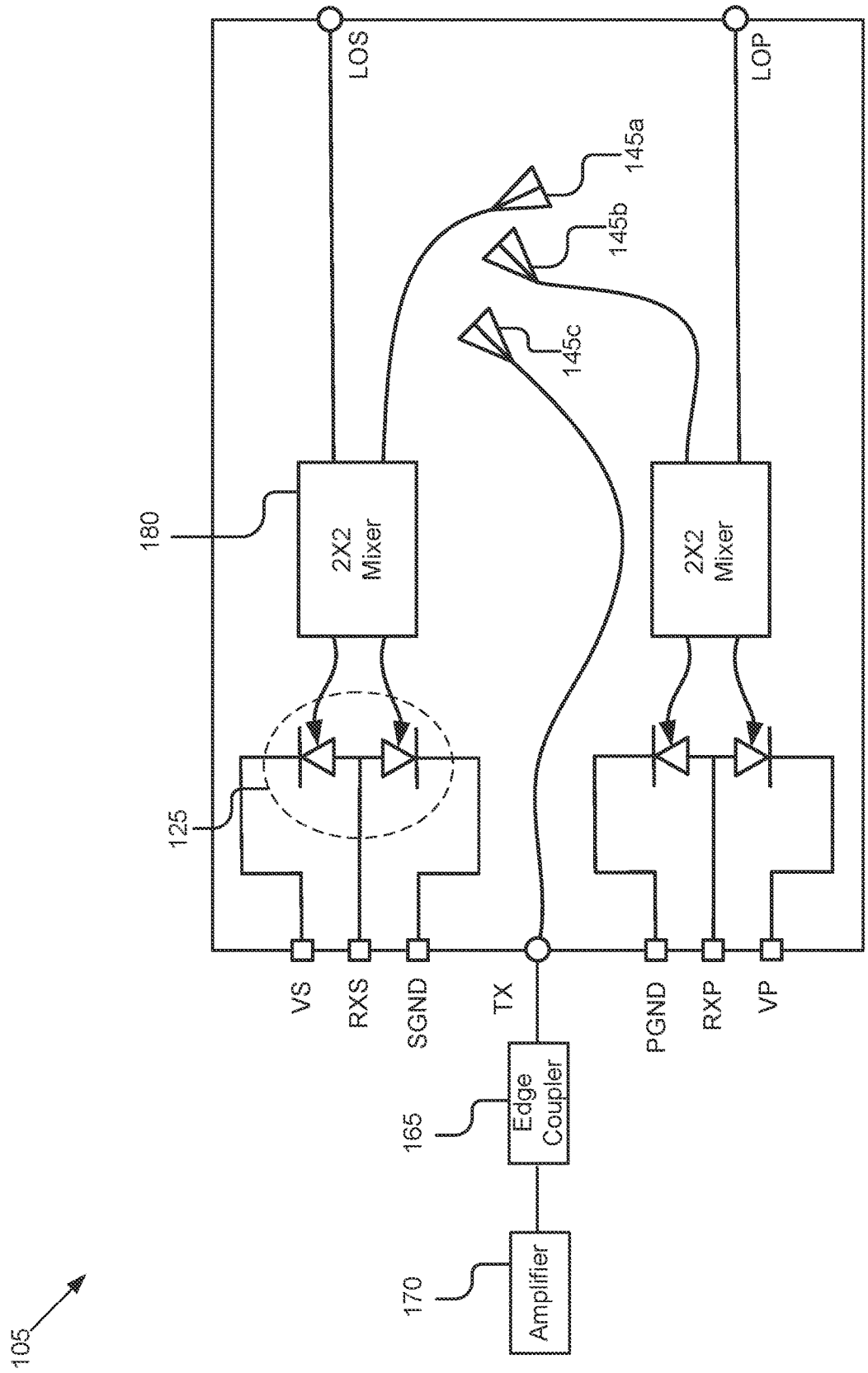
FIG. 1B is a high-level schematic diagram of a silicon photonics device for a coherent LIDAR system according to some implementations.

FIG. 1B is an example high-level schematic diagram of a silicon photonics device 105 for a coherent LIDAR system according to some implementations. The silicon photonics device 105 includes a configuration of photodiodes (PD) 125, grating couplers 145, an edge coupler 165, and 2×2 mixers 180. In some implementations, the PD 125 may be a Germanium (Ge) PD. In other implementations, the PD 125 may be a silicon PD, an indium gallium arsenide PD, a mercury cadmium telluride PD, a lead(II) sulfide PD, a molybdenum disulfide PD, graphene PD, and/or combinations thereof. The grating couplers 145 may be used to couple light to and from the silicon photonics device 105. The operation of the grating couplers 145 is associated with the refractive index variations caused by either etching or deposition on silicon-on-insulator (SOI) wafer during fabrication process. In some implementations, the grating couplers 145 may be one-dimensional grating couplers. For example, if the refractive index of a grating coupler 145 varies only in one direction, it is a one-dimensional grating coupler and the light is coupled in the direction of index variation. In other implementations, the grating couplers 145 may be two-dimensional grating couplers. The grating couplers 145a, 145b, and 145c may be free-space couplers. The grating couplers 145a and 145b are associated with receiver antennas and the grating coupler 145c is associated with a transmitter antenna. Each 2×2 mixer 180 is a frequency mixer that receives as input one of the Local Oscillator (LO) signals (e.g., LOS and LOP) and the received signal via one of the grating couplers (e.g., 145a and 145b) associated with the receiver antennas. The output signals from the mixer 180 are then directed to the photodiode 125 for detection and sensing. The edge coupler 165 is coupled to an amplifier 170. The amplifier 170 is a light source for the silicon photonics device 105. For example, the amplifier 170 generates light which gets coupled into the silicon photonics device 105 via the edge coupler 165. The transmit (TX) port connected to the grating coupler 145c associated with the transmitter antenna is directly or indirectly coupled to the edge coupler 165.

Figure 2:
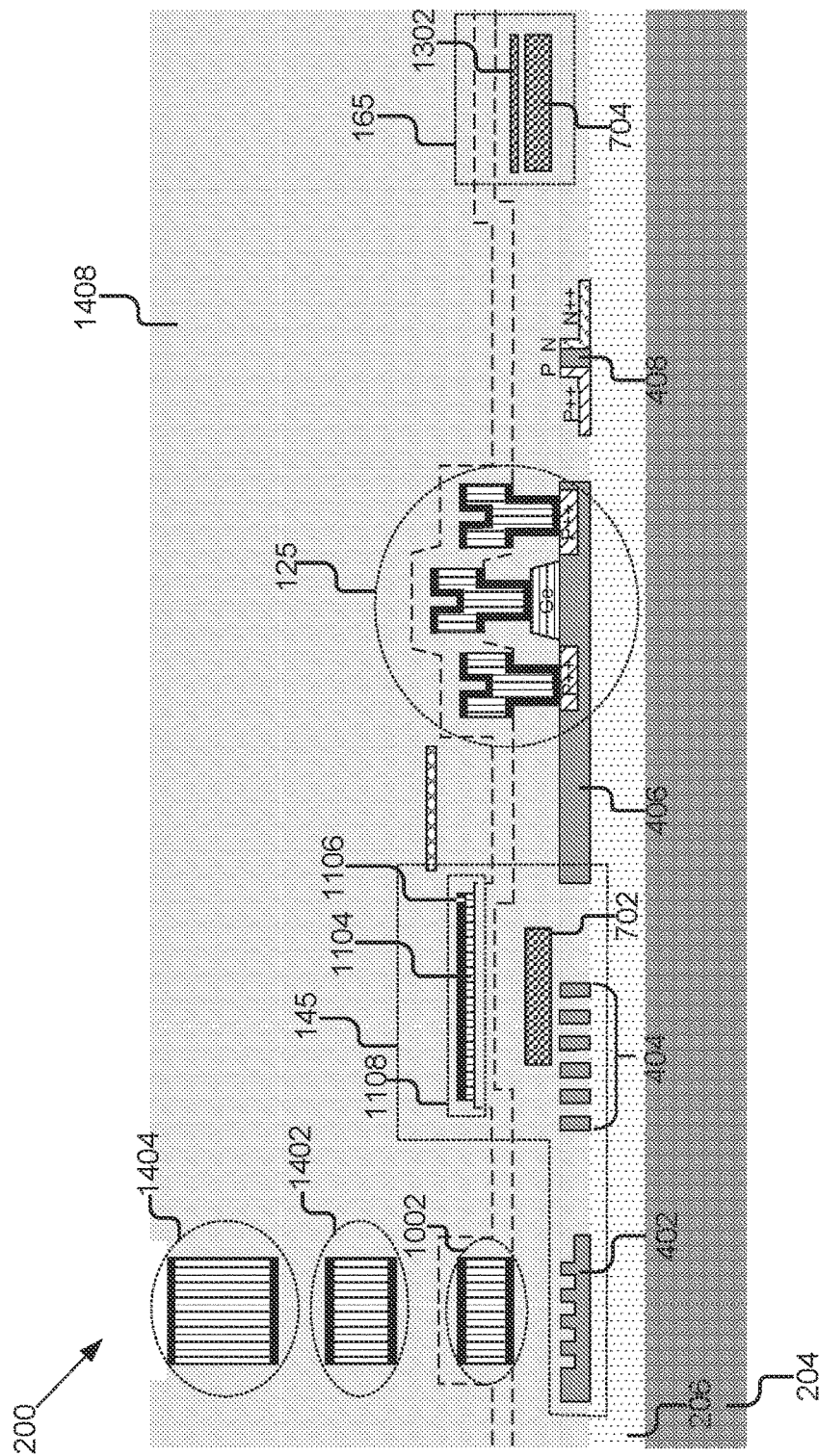
FIG. 2 depicts a schematic, cross-sectional diagram representing a structure of the silicon photonics device shown in FIG. 1B according to some implementations.

FIG. 2 depicts a schematic, cross-sectional diagram representing a structure of the silicon photonics device 200 for the coherent LIDAR system according to some implementations. The structure of the silicon photonics device 200 is fabricated using a silicon-on-insulator (SOI) wafer. As shown in FIG. 3, a SOI wafer 300 may include a SOI layer 202, a buried oxide (BOX) layer 206, and a bulk silicon substrate member 204 providing support for the SOI wafer. The BOX layer 206 is in between the SOI layer 202 and the bulk silicon substrate member 204. The SOI layer 202 may be etched and patterned into one or more silicon structures 402, 404, 406 and 408 coupled to the bulk silicon substrate member 204. For example, the SOI layer 202 may be a crystalline silicon (c-Si) layer. Portions of c-Si layer disposed above the BOX layer 206 may be selectively and partially etched to pattern one or more silicon structures 402, 404, 406, and 408. The silicon structures 402, 404, 406, and 408 may include one or more of an island structure, a rib structure, a grat structure, and a slab structure. The silicon structures may include one or more non-uniform grating structures that form optical waveguides used for optical input and output. In addition to optical waveguides, other optical device structures, such as lasers, optical modulators, photodetectors, and optical switches may also be fabricated in the SOI layer 202. An edge depth of the partially etched silicon structures in the SOI layer 202 may be in a range between about 50 nm and about 300 nm. A thickness of the BOX layer 206, for example, is about 3000 nm but may have a range anywhere between about 1500 nm and about 3500 nm. As described in detail below, a dielectric material or an insulator compound layer may be disposed above the silicon structures and etched to pattern one or more insulating or dielectric structures. For example, a first insulating structure 702 is patterned and etched in the insulator compound layer for coupling to the isolated silicon structures 404. In this implementation, the first insulating structure 702 is coplanar with a second insulating structure 704. The thickness or height of the insulating structures 702 and 704, for example, is about 400 nm in FIG. 2 but may have a range anywhere between about 300 nm and about 600 nm. In some implementations, the insulator compound layer may be a dielectric material whose optical refractive index is greater than a cladding material that it may be in contact with. For example, the insulator compound layer may be silicon nitride ($Si_3N_4$) layer. One advantage of using $Si_3N_4$ layer in the silicon photonics chip for coherent LIDAR system is its capability to handle higher optical power. In another example, the insulator compound layer may be amorphous silicon (a-Si) layer, crystalline silicon (c-Si) layer, etc. A distance between the bottom of the first insulating structure 702 and a top of the silicon structures, for example, is about 240 nm but may have a range anywhere between about 100 nm and about 500 nm. A germanium (Ge) photodiode 125 may be fabricated onto a silicon structure via doping.

The structure of the silicon photonics device 200 may include multiple metal routing layers Metal 1 (MT1) layer 1002, Metal 2 (MT2) layer 1402, and Metal 3 (MT3) layer 1404 for forming interconnects. The metal routing layers 1002, 1402, and 1404 may be composed of one or more of aluminum, copper, gold, silver, and/or a combination thereof. Following a formation of MT1 layer 1002, a Metal 0 (MT0) layer 1108 may be coupled to the first insulating structure 702. In some implementations, a diffusion barrier and adhesion layer 1106 may be coupled to the metal layer 1104. For example, the diffusion barrier and adhesion layer 1106 may be disposed above or over a top of the metal layer 1104. The MT0 layer 1108 composed of the metal layer 1104 and the diffusion barrier and adhesion layer 1106 may form a reflective mirror structure that is coupled to the first insulating structure 702. In other implementations, the diffusion barrier and adhesion layer 1106 having a good optical property, such as reflectivity may be disposed over a top and a bottom of the metal layer 1104. The diffusion barrier and adhesion layer 1106 may be tantalum nitride, indium oxide, copper silicide, tungsten nitride, titanium nitride, and/or a combination thereof. There is an oxide layer or cladding 1408 filling a space between the different structures formed on the silicon photonics device 200. The distance separating the top of the first insulating structure 702 and the bottom of the MT0 layer 1108, for example, is about 900 nm but may have a range anywhere between about 500 nm and about 1600 nm. The distance separating the bottom of the MT0 layer 1108 and the top of the silicon structures 404 is about 1140 nanometers but may have a range anywhere between about 800 nanometers and about 1200 nanometers. In some implementations, a thickness of the metal layer 1104 may be twice than that of the diffusion barrier and adhesion layer 1106. For example, the thickness of the metal layer 1104 may be about 100 nm and the thickness of the diffusion barrier and adhesion layer 1106 may be about 50 nm. Thus, the thickness of the MT0 layer 1108 is about 150 nm. Further, a thin insulating structure 1302 of the same insulator material as the first insulating structure 702 and the second insulating structure 704 may be coupled to the second insulating structure 704. For example, the thin insulating structure 1302 may be disposed above the second insulating structure 704. In some implementations, the thickness of the thin insulating structure 1302 may be less than that of the second insulating structure 704 by a factor of about 3.6. For example, if the thickness of the second insulating structure 704 is about 400 nm, then the thickness of the thin insulating structure 1302 is about 110 nm. The distance between the bottom of the thin insulating structure 1302 and the top of the second insulating structure 704 may be about 450 nm.

In FIG. 2, one or more of the MT0 layer 1108, the first insulating structure 702, and the partially etched silicon structures 402, 404 form grating couplers 145 for coupling into free-space. For example, the MT0 layer 1108 and the silicon structure 402 form a grating coupler 145 associated with a receiver antenna in the silicon photonics device 200 for the coherent LIDAR system. In another example, the MT0 layer 1108, the first insulating structure 702, and the silicon structures 404 form a grating coupler 145 associated with a transmitter antenna in the silicon photonics device 200 for the coherent LIDAR system. The MT0 layer 1108 serves as a silicon photonics chip-to-free space interface. The BOX layer 206 serves as a low-optical refractive index cladding material. The oxide layer cladding 1408 also serves as a low-optical refractive index cladding material. Cladding may be one or more layers of lower optical refractive index material in contact with a core material of higher optical refractive index, such as the silicon structures 402, 404 and insulating structures 702, 704. The thin insulating structure 1302 disposed on the top of the second insulating structure 704 and overlapping with the second insulating structure 704 forms an edge coupler 165 for coupling to another semiconductor device or silicon photonics device, such as an amplifier 170. The conjunction of the thin insulating structure 1302 and the second insulating structure 704 serves as an amplifier-to-silicon photonics chip interface. Although FIG. 2 depicts the thin insulating structure 1302 and the second insulating structure 704 overlapping from edge to edge, it should be understood that there can be an offset in their overlap. In some implementations, the edge coupler 165 may be fabricated with a single insulating structure. An edge coupler 165 fabricated with a configuration of double insulating structures 704 and 1302 provides a higher coupling efficiency (CE) than a configuration with a single insulating structure and it also better matches the optical mode of the coherent LIDAR system. In other implementations, a structure of the edge coupler 165 may be patterned in the crystalline silicon (c-Si) layer itself without a need for the use of the insulator compound, such as $Si_3N_4$.

In some implementations, the structure of the grating couplers 145 may be configured using another top insulating structure (not shown in FIG. 2) above the first insulating structure 702. This top insulating structure may be of the same insulator material as the first insulating structure 702. Either the top insulating structure or the first insulating structure 702 below it may be etched and patterned to form several isolated bars of insulating structures and combined with the MT0 layer 1108 to form grating couplers 145. For example, if the several isolated bars of insulating structures were patterned into the top insulating structure, those isolated bars in conjunction with the MT0 layer 1108 can form a grating coupler associated with a receiver antenna. In another example, if several isolated bars of insulating structures were patterned into the first insulating structure 702, those isolated bars in conjunction with the top insulating structure and the MT0 layer 1108 can form a grating coupler associated with a transmitter antenna. In other implementations, the silicon structures 402, 404 and the isolated bars of the insulating structures patterned either on the top insulating structure or the first insulating structure 702 may be mixed and matched with the MT0 layer 1108 to form grating couplers 145.

An advantage of the structure of the grating coupler 145 etched and patterned into the silicon photonics device 200 in FIG. 2 is that it facilitates with meeting the link budget requirements for use in an automotive grade LIDAR system. For example, the structure of the grating coupler 145 may reduce insertion loss at interfaces between the silicon photonics device 200 for coherent LIDAR and free space on both the transmitting and receiving paths, resulting in about 2 dB to 6 dB improvement in overall link budget. The optical loss from a transmitter or output type grating coupler is counted twice in the link budget since light exits such a coupler, reflects off of a target, and returns to the grating coupler. The structure of the grating coupler 145 may facilitate with achieving a coupling loss of approximately 0.25 dB if there are no lithographic constraints. With lithographic constraints, the structure of the grating coupler 145 may facilitate with achieving a coupling loss of about 0.5 dB to about 1.0 dB.

FIGS. 3-17 depict schematic, cross-sectional diagrams illustrating a method for fabricating the silicon photonics device according to some implementations.

As shown in FIG. 3, a SOI wafer 300 is provided. In some implementations, the SOI wafer 300 may be a three-layer wafer including bulk silicon substrate member 204 as a first or base layer, a buried oxide (BOX) layer 206 of electrically insulating material, such as silicon dioxide ($SiO_2$), having a thickness of about 3000 nm as a second or intermediate layer, and an active crystalline silicon (c-Si) SOI layer 202 having a thickness of about 220 nm as a third or top layer.

As shown in FIG. 4, the c-Si layer or the SOI layer 202 shown in FIG. 3 may be patterned and etched with precision to form non-uniform silicon structures, such as grat 402, rib 404, island 406, and slab 408 disposed above the BOX layer 206. The rest of the SOI layer 202 shown in FIG. 3 may be etched down to the BOX layer 206. The grat 402 silicon structure is etched to a depth of about 70 nm and the slab 408 silicon structure is etched to a depth of about 130 nm from the top. The rib 404 structure is patterned and etched into isolated, full thickness (e.g., 220 nm) bars of silicon structures.

As shown in FIG. 5, an oxide layer or cladding 502 is then deposited over the silicon structures 402, 404, 406, and 408 to a height of about 240 nm from the top of the silicon structures 402, 404, 406, and 408. Following the oxide deposition, the top of the SOI wafer 300 is subjected to a chemical mechanical polishing (CMP) or planarization process. This oxide layer deposition and planarization process is performed to form a spacer between the silicon structures 402, 404, 406, and 408 and an insulator compound or material that will be deposited next on top of the SOI wafer 300.

As shown in FIG. 6, a first layer 602 and a second layer 604 of an insulator compound or material, such as silicon nitride ($Si_3N_4$) is then deposited on a top of the oxide layer 502 and a bottom of the substrate member 204. This deposition may be achieved using chemical vapor deposition method. A thickness of the deposited first layer 602 on the top of the SOI wafer 300 is about 400 nm. In some implementations, the chemical vapor deposition method used may be low pressure chemical vapor deposition (LPCVD) method. In LPCVD method, the $Si_3N_4$ is deposited on both sides (top and bottom) of the SOI wafer 300. The LPCVD method of deposition may exert a strong tensile stress on the SOI wafer 300 and deform it. This double-sided deposition of $Si_3N_4$ is performed to cancel the impact of tensile stress and avoid warping of the SOI wafer 300 structure. In some implementations, a plasma-enhanced chemical vapor deposition (PECVD) may be used as a method to deposit the layer of insulator compound on top of the SOI wafer 300. In PECVD method, double-sided deposition of the insulator compound may not be needed. In some implementations, amorphous silicon (a-Si) may be used as an insulator compound.

As shown in FIG. 7, the deposited layer 602 on top of the oxide layer 502 from FIG. 6 is patterned and etched to form two coplanar insulating structures or dielectric elements 702 and 704 disposed above the oxide layer 502. The insulating structure 702 may overlap and couple to the silicon structure 404. The rest of the deposited layer 602 on top of the oxide layer 502 is etched down to the oxide layer 502. The thickness of the two coplanar insulating structures 702 and 704, for example, is about 400 nm. After the deposited layer 602 on top of the SOI wafer 300 is patterned and etched, the SOI wafer 300 may be cleaned to remove all the photoresist.

As shown in FIG. 8, the deposited layer 604 on the bottom of the substrate member 204 from FIG. 7 is removed subsequent to the formation of the two coplanar insulating structures 702 and 704. As the deposited layer 602 on top of the SOI wafer 300 from FIG. 6 is patterned and etched, it releases the tensile stress exerted on top of the SOI wafer 300. The deposited layer 604 on the bottom of the SOI wafer 300 from FIG. 7 is removed to balance out the tensile stress exerted on the bottom of the SOI wafer 300. After the deposited layer 604 on the bottom of the SOI wafer 300 is removed, the top of the SOI wafer 300 may be deep cleaned to remove contaminants that may have transferred to the top of the SOI wafer 300.

Figure 9:
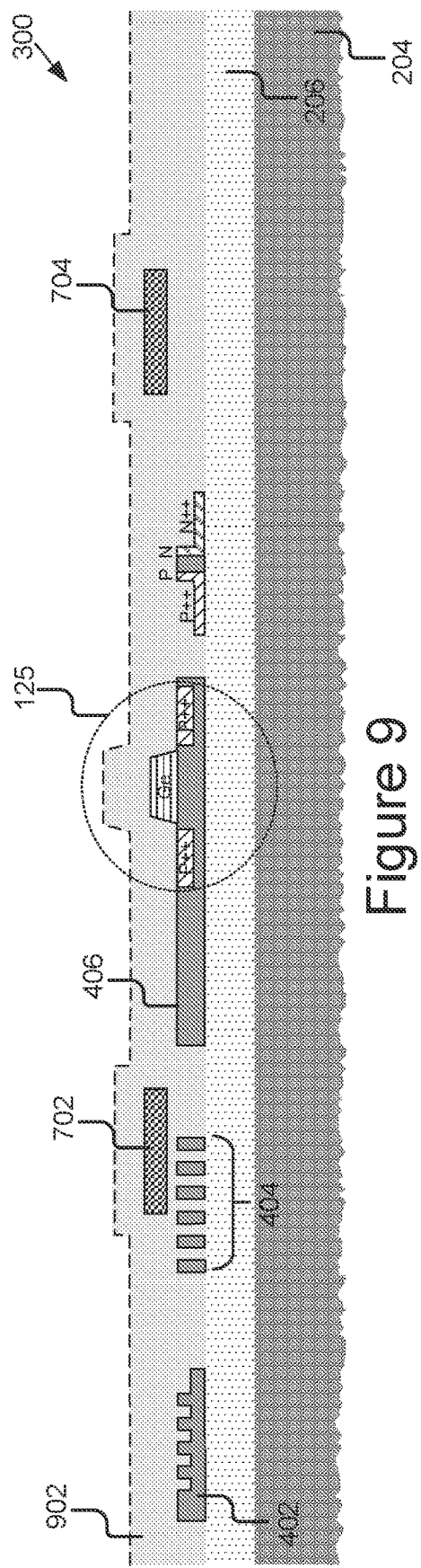

As shown in FIG. 9, an etched silicon structure 406 disposed above the BOX layer 206 is doped to form a photodiode 125. For example, germanium may be used as the material for forming the photodiode 125 in FIG. 9. It should be understood that other materials, such as silicon, indium gallium arsenide, lead (II) sulfide, mercury cadmium telluride, or a combination thereof may also be used to form their respective photodiodes. Subsequent to the formation of the photodiode 125, another layer of oxide 902 is deposited on top of the SOI wafer 300.

Figure 10:
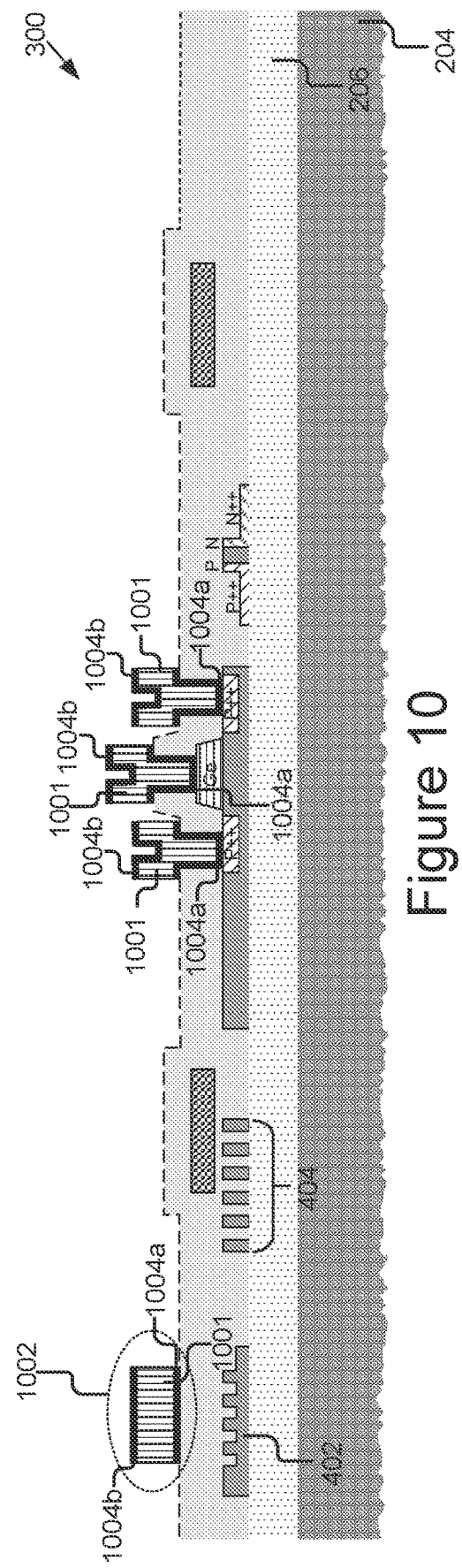

As shown in FIG. 10, a Metal 1 (MT1) layer 1002 and three conductive vias on the terminals of the photodiode 125 are formed. The MT1 layer 1002 and the conductive vias are formed by first depositing and patterning a first diffusion barrier and adhesion layer 1004a. Then, by depositing and patterning metal 1001 in the middle. Lastly, by depositing and patterning a second diffusion barrier and adhesion layer 1004b. In other words, the metal 1001 is sandwiched between the two thin diffusion barrier and adhesion layers 1004a and 1004b. In some implementations, the metal 1001 may be deposited using one or more of aluminum, copper, gold, silver, or a combination thereof. In some implementations, the diffusion barrier and adhesion layer 1004a and 1004b may be deposited using tantalum nitride (TaN). A thickness of the diffusion barrier and adhesion layers 1004a and 1004b is about 50 nm. The thickness of the metal 1001 deposited for forming the MT1 layer 1002 is about 750 nm. A distance between the MT1 layer 1002 and a top of the silicon structure 402 is about 740 nm.

As shown in FIG. 11, a Metal 0 (MT0) layer 1108 is formed. The purpose of this new MT0 layer 1108 is to form highly-reflective mirror structures in the silicon photonics device 105. Following the formation of the MT1 layer 1002 in FIG. 10, an oxide layer 1102 of about 300 nm thickness is deposited on top of the SOI wafer 300 as shown in FIG. 11. A metal layer 1104 is deposited and patterned above the first insulating structure 702. The thickness of this metal layer 1104 deposition is about 100 nm. The diffusion barrier and adhesion layer 1106 may then be deposited and patterned on top of the metal layer 1104 to improve adhesion. The thickness of this top diffusion barrier and adhesion layer 1106 is about 50 nm. The deposited metal layer 1104 and the diffusion barrier and adhesion layer 1106 thus form the MT0 layer 1108 as shown in FIG. 11. The formation of the MT0 layer 1108 differs in that a base diffusion barrier and adhesion layer is not deposited prior to depositing the metal layer 1104. That is, the metal layer 1104 is deposited first without a diffusion barrier and adhesion layer beneath it. For example, the diffusion barrier and adhesion layer of tantalum nitride (TaN) material has poor reflectivity. If the TaN diffusion barrier and adhesion layer is deposited prior to the metal layer 1104, it may negatively affect the reflectivity of the MT0 layer 1108 to form the highly-reflective mirror structures. In other implementations, a material having good optical property in terms of reflectivity may be used as a diffusion barrier and adhesion layer beneath the metal layer 1106. In between the subsequent formations of MT1 layer 1002 and MT0 layer 1108, there is an intentional omission of chemical mechanical polishing (CMP) process for planarization of the SOI wafer 300. The CMP process may introduce uncertainty to the oxide spacing between the two different layers. This intentional omission of CMP process is carried out to minimize the variations in the oxide spacing. In some implementations, the SOI wafer 300 may be subjected to the CMP process between the subsequent formations of MT1 layer 1002 and MT0 layer 1108. An opening can be etched in the oxide spacing to a desired depth at which the MT0 layer 1108 may be patterned. The configuration of the MT0 layer 1108, the insulating structure 702, and the silicon structures 402, 404 form one or more grating couplers 145 as described herein. A distance between a bottom of the MT0 layer 1108 and a top of the silicon structure 404 is about 1140 nm. A distance between the bottom of the MT0 layer 1108 and a top of the insulating structure 702 is about 900 nm. A distance between the bottom of the first insulating structure 702 and a top of the silicon structure 404 is about 240 nm.

As shown in FIG. 12, another oxide layer 1202 is deposited over the MT1 layer 1002, MT0 layer 1108, oxide layer 1102, and other structures on the top. Following the oxide deposition, the top of the SOI wafer 300 is subjected to a chemical mechanical polishing (CMP) or planarization process.

Figure 13:
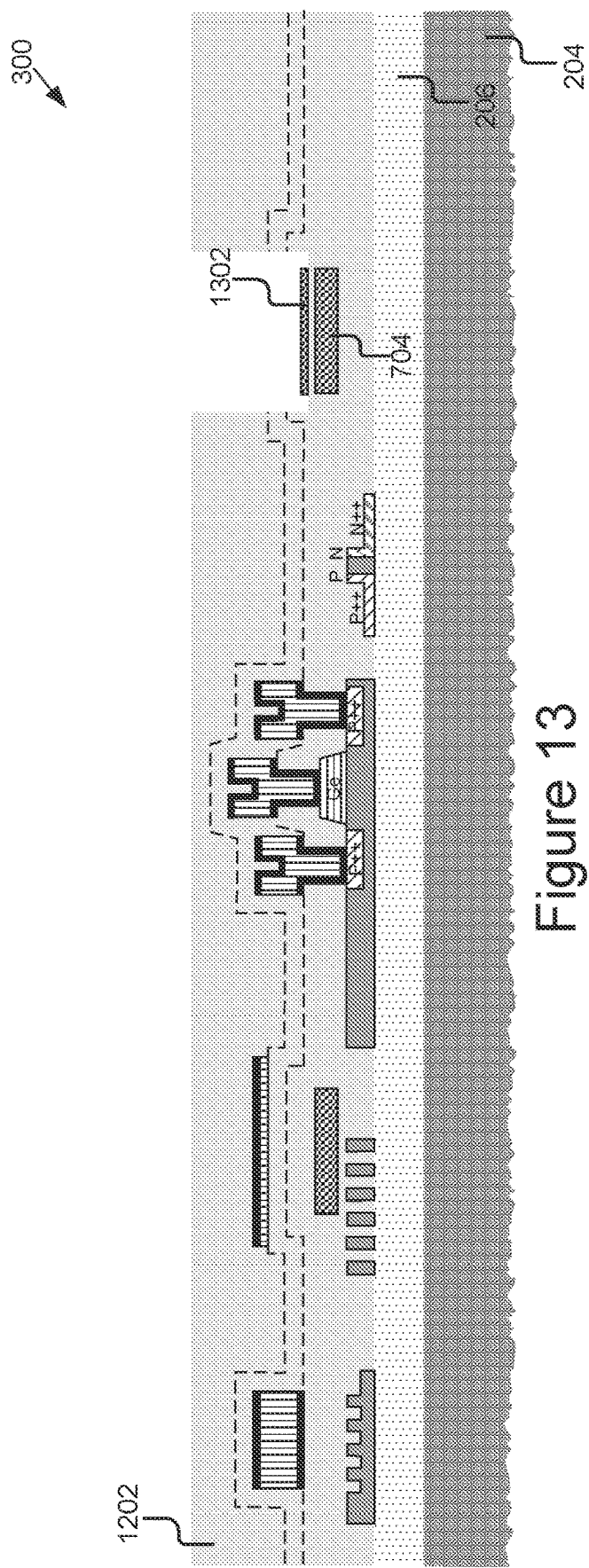

As shown in FIG. 13, an opening may be etched in the oxide layer 1202 above the second insulating structure 704. A thin layer of insulator compound, such as $Si_3N_4$ is deposited in the opening and patterned to form a thin insulating structure 1302 on top of the second insulating structure 704. A thickness of the thin insulating structure 1302 is about 110 nm. The distance between the bottom of the thin insulating structure 1302 and the top of the second insulating structure 704 is about 450 nm. The configuration of the thin insulating structure 1302 on top of the second insulating structure 704 forms an edge coupler 165 as described herein.

Figure 14:
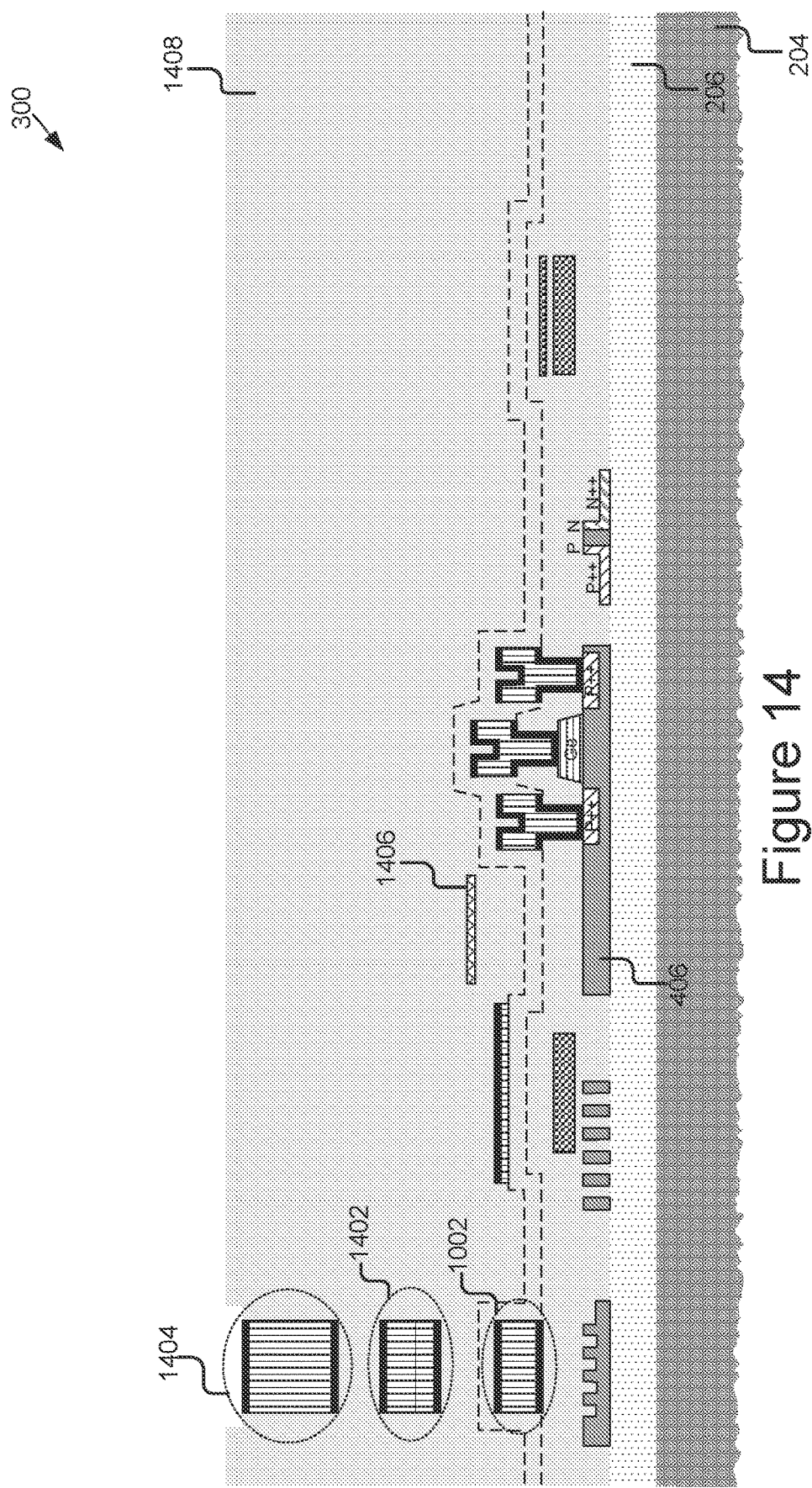

As described in FIG. 14, back end of line fabrication steps are performed. This includes formation of Metal 2 (MT2) layer 1402 and Metal 3 (MT3) layer 1404, addition of conductive vias connecting the different metal layers, deposition of more oxide layer 1408, deposition of a heater HTR 1406, and performance of chemical mechanical polishing (CMP) processing steps. The thickness of deposited metal in MT3 layer 1404 is about twice as that of the MT2 layer 1402. For example, the thickness of deposited metal in MT2 layer 1402 is about 1000 nm and the thickness of deposited metal in MT3 layer 1404 is about 2000 nm. A thin coating of diffusion barrier and adhesion layer is deposited on top and bottom of the deposited metal in the MT2 layer 1402 and the MT3 layer 1404. A thin film of a resistive metallic alloy is deposited as a heater HTR 1406 above the silicon structures etched from the SOI layer. An example of a resistive metallic alloy is titanium nitride (TiN). The HTR 1406 may be used to heat up the silicon photonics device chip. The heater HTR 1406 may also be used to change a refractive index of the waveguide structures which in turn is useful for the operation of phase shifters and optical switches. A distance between the bottom of the heater HTR 1406 and a top of the silicon structure 406 is about 3000 nm. A distance between a top of the MT1 layer 1002 and the bottom of the MT2 layer 1402 is about 1100 nm. A distance between a top of the MT2 layer 1402 and the bottom of the MT3 layer 1404 is about 800 nm. An opening may be etched in the oxide layer 1408 just above the MT3 layer 1404 to a depth of about 200 nm for forming contact into the silicon photonics device chip.

Figure 15:
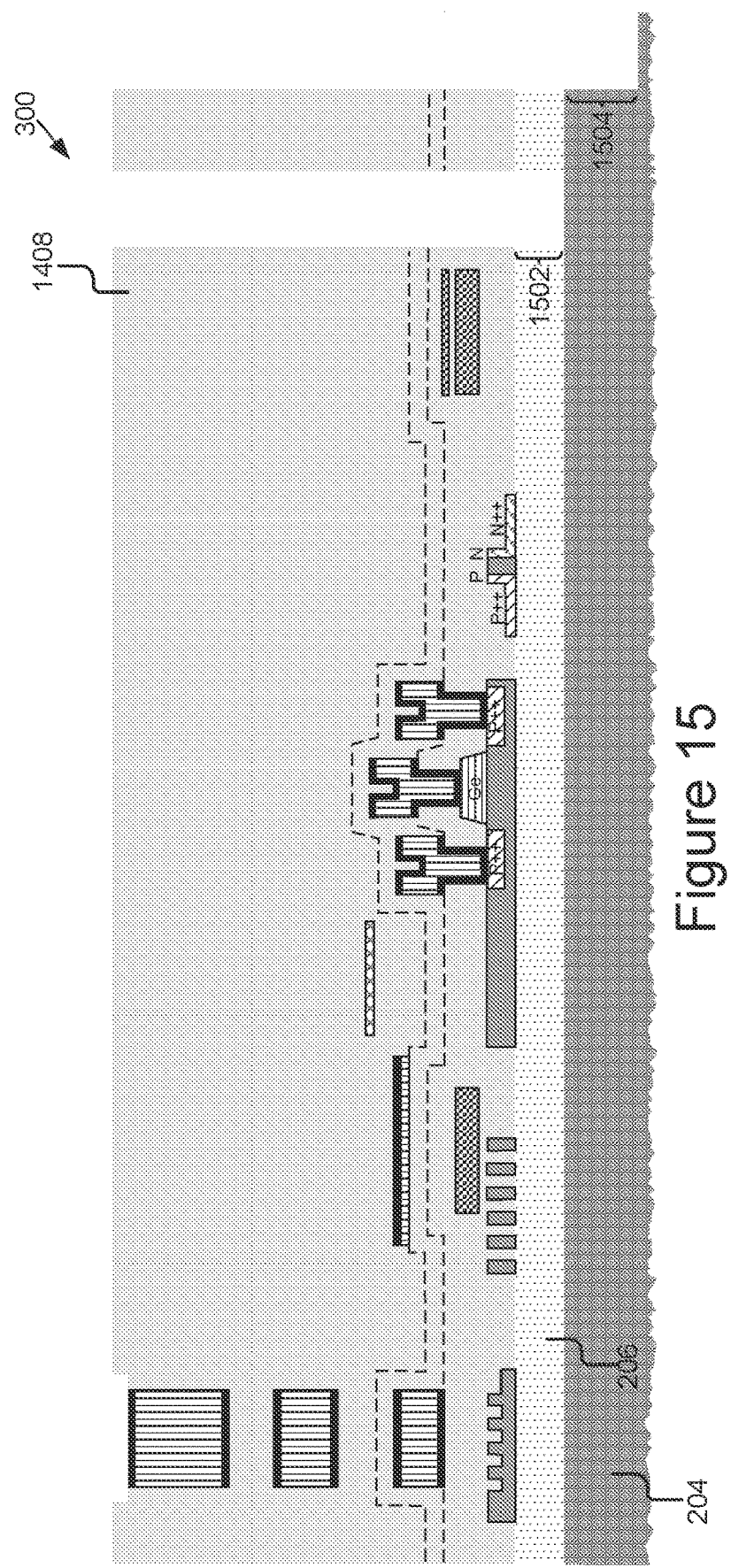

As shown in FIG. 15, a shallow trench DT_OX 1502 into the BOX layer 206 and a deep trench DT_SI 1504 into the substrate member 204 are formed. The formation of the shallow trench DT_OX 1502 removes the oxide layer 1408 and the BOX layer 206 down to the substrate member 204. The depth of the DT_SI 1504 is about 150 μm.

Figure 16:
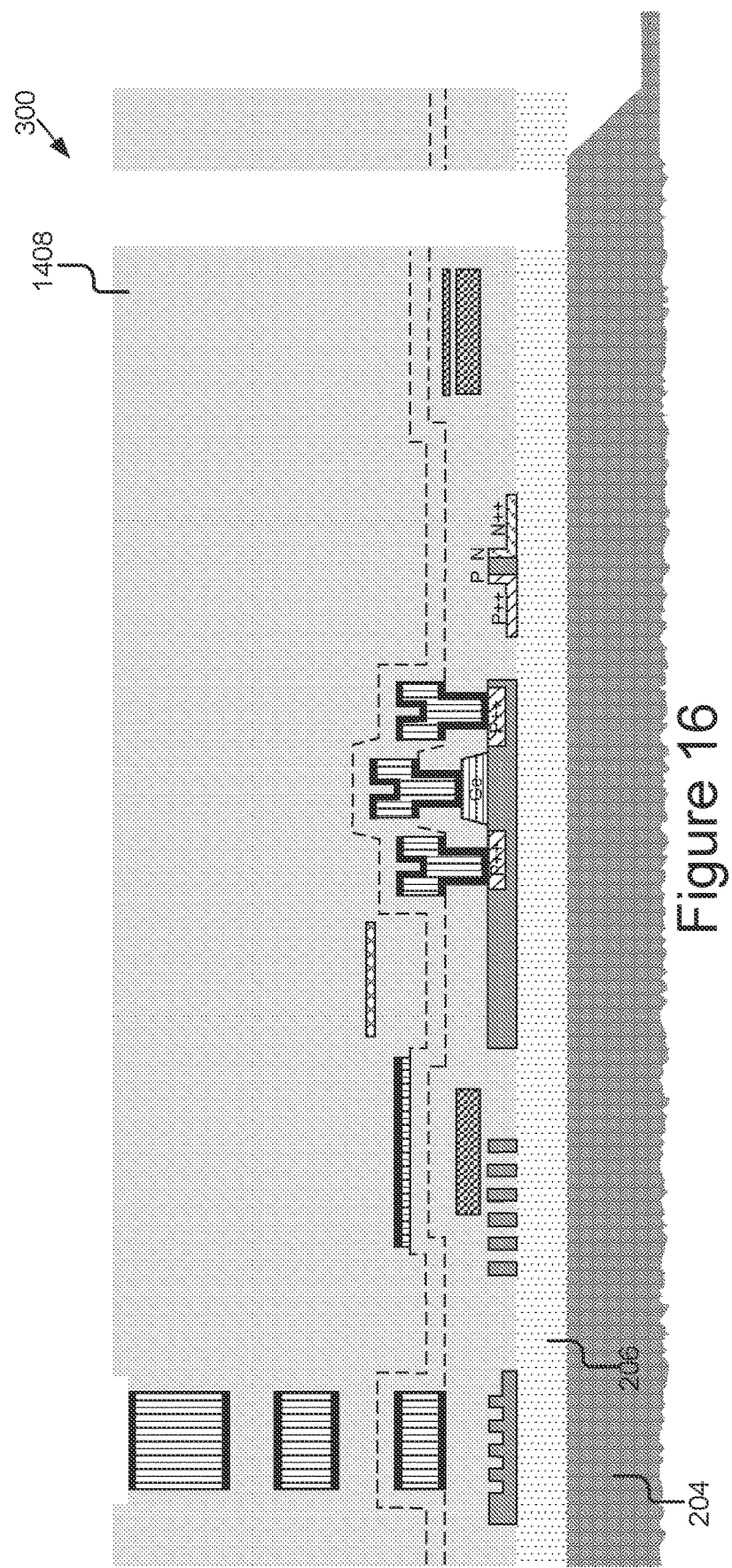

As shown in FIG. 16, an undercut etch is performed to release the suspended structures.

Figure 17:
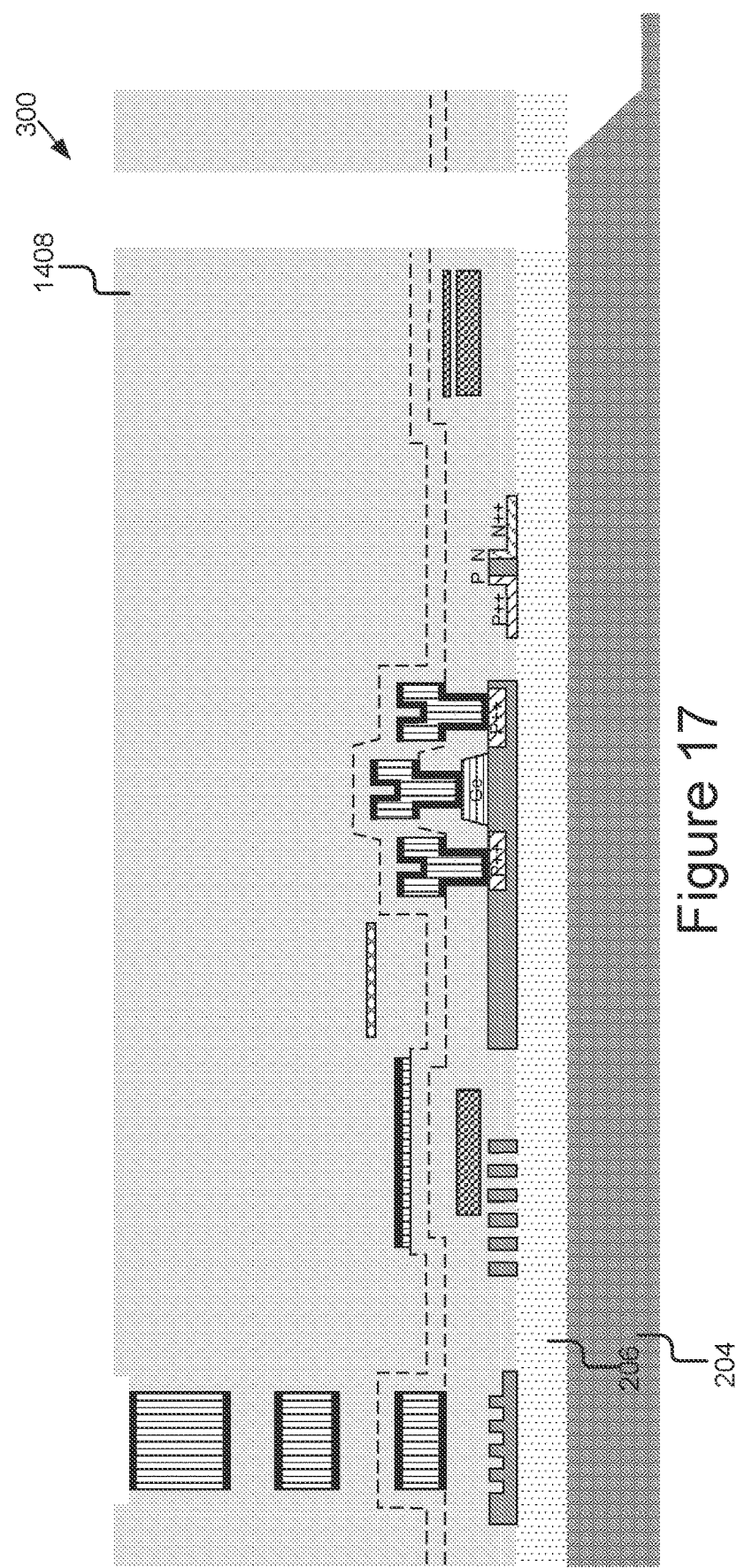

As shown in FIG. 17, a back of the SOI wafer 300 is polished to optical quality. A thickness of the substrate member or handle 204 is about 600 μm after backside polishing of the SOI wafer 300.

The schematic as described above is part of the design for an integrated circuit chip. The chip design is created in a graphical computer programming language and stored in a computer readable storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the computer readable storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The foregoing detailed description of the present disclosure has been presented for purposes of illustration and description. It is not intended to be exhaustive or to limit the present disclosure to the precise form disclosed. Many modifications and variations are possible in light of the above teachings. The described implementations were chosen in order to best explain the principles of the present disclosure and its practical application, to thereby enable others skilled in the art to best utilize the present disclosure in various implementations and with various modifications as are suited to the particular use contemplated. It is intended that the scope of the present disclosure be defined by the claims appended hereto.

Although some implementations of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present disclosure is not intended to be limited to the particular implementations of the process, machine, fabrication, composition of matter, means, methods, and steps described in the specification. As one of ordinary skill in the art will readily appreciate from the description of the present disclosure, processes, machines, fabrication, compositions of matter, means, methods, or steps, presently existing or later to be developed, that perform substantially the same function or achieve substantially the same result as the corresponding implementations described herein may be utilized according to the present disclosure. Accordingly, the appended claims are intended to include within their scope such processes, machines, fabrication, compositions of matter, means, methods, or steps.

What is claimed is:

1. A silicon photonics device for a LIDAR sensor of a vehicle, comprising:
    a substrate member;
    a silicon-on-insulator (SOI) layer formed on the substrate member; and
    a first antenna of the LIDAR sensor formed on the substrate member, the first antenna including:
        a first grating structure in the SOI layer coupled to the substrate member;
        a first dielectric structure coupled to the first grating structure; and
        a first metal layer coupled to the first dielectric structure.

2. The silicon photonics device of claim 1, further comprising:
    an edge coupler formed on the substrate member, the edge coupler including:
        a second dielectric structure coupled to the substrate member; and
        a third dielectric structure coupled to the second dielectric structure.

3. The silicon photonics device of claim 1, further comprising:
    a second antenna of the LIDAR sensor formed on the substrate member, the second antenna including:
        a second grating structure in the SOI layer coupled to the substrate member; and
        the first metal layer coupled to the second grating structure.

4. The silicon photonics device of claim 3, further comprising:
    a photodiode formed on the substrate member and coupled to the second antenna.

5. The silicon photonics device of claim 1, wherein the first antenna further includes:
    a diffusion barrier and adhesion layer on top of the first metal layer, the diffusion barrier and adhesion layer and the first metal layer forming a reflective minor structure.

6. The silicon photonics device of claim 1, wherein the first antenna is a one-dimensional grating coupler.

7. The silicon photonics device of claim 1, wherein the first antenna further includes an intermediate oxide layer between the first grating structure and the first dielectric structure and between the first dielectric structure and the first metal layer.

8. The silicon photonics device of claim 1, wherein the first metal layer is a Metal 0 (MT0) layer.

9. The silicon photonics device of claim 1, wherein the first metal layer is one from a group of aluminum, gold, silver, and copper.

10. The silicon photonics device of claim 2, wherein the first dielectric structure and the second dielectric structure are co-planar.

11. The silicon photonics device of claim 2, wherein the first dielectric structure, the second dielectric structure, and the third dielectric structure are formed using one from a group of silicon nitride and silicon.

12. The silicon photonics device of claim 5, wherein the diffusion barrier and adhesion layer is one from a group of tantalum nitride, indium oxide, copper silicide, tungsten nitride, and titanium nitride.

13. The silicon photonics device of claim 1, wherein a first distance between a bottom of the first dielectric structure and a top of the first grating structure is in a range between 100 nanometers and 500 nanometers, a second distance between a bottom of the first metal layer and the top of the first grating structure is in a range between 800 nanometers and 1200 nanometers, and a third distance between a top of the first dielectric structure and the bottom of the first metal layer is in a range between 500 nanometers and 1600 nanometers.

14. The silicon photonics device of claim 2, wherein a fourth distance between a top of the second dielectric structure and a bottom of the third dielectric structure is about 450 nanometers.

15. The silicon photonics device of claim 2, wherein the first dielectric structure and the second dielectric structure have a same height.

16. The silicon photonics device of claim 2, wherein a height of the third dielectric structure is less than that of the second dielectric structure by a factor of about 3.

17. The silicon photonics device of claim 5, wherein a height of the first metal layer is twice than that of the diffusion barrier and adhesion layer.

18. A LIDAR sensor for a vehicle, the LIDAR sensor comprising:
    a silicon photonics device, the silicon photonics device including:
        a substrate member;
        a silicon-on-insulator (SOI) layer formed on the substrate member; and
        a first antenna of the LIDAR sensor formed on the substrate member, the first antenna including:
            a first grating structure in the SOI layer coupled to the substrate member;
            a first dielectric structure coupled to the first grating structure; and
            a first metal layer coupled to the first dielectric structure.

19. The LIDAR sensor of claim 18, wherein the silicon photonics device further comprises:
    a second antenna formed on the substrate member, the second antenna including:
        a second grating structure in the SOI layer coupled to the substrate member; and
        the first metal layer coupled to the second grating structure.

20. An autonomous vehicle control system comprising:
    a silicon photonics device for a LIDAR sensor of a vehicle, the silicon photonics device including:
        a substrate member;
        a silicon-on-insulator (SOI) layer formed on the substrate member; and
        an antenna of the LIDAR sensor formed on the substrate member, the antenna including:
            a first grating structure in the SOI layer coupled to the substrate member;
            a first dielectric structure coupled to the first grating structure; and
            a first metal layer coupled to the first dielectric structure.

* * * * *